United States Patent [19]
Mizuno et al.

[11] Patent Number: 4,646,282
[45] Date of Patent: Feb. 24, 1987

[54] STYLUS FOR CAPACITY CHANGE DETECTION TYPE DISC SYSTEM

[75] Inventors: Hideaki Mizuno, Tokyo; Keiichiro Doi, Yokohama, both of Japan

[73] Assignee: Victor Company of Japan, Limited, Kanagawa, Japan

[21] Appl. No.: 597,769

[22] Filed: Apr. 6, 1984

[30] Foreign Application Priority Data

Apr. 8, 1983 [JP] Japan .................................. 58-61910

[51] Int. Cl.[4] .......................... C23C 11/00; G11B 7/00
[52] U.S. Cl. .................................... 369/126; 369/173; 427/38
[58] Field of Search ............... 369/126, 150, 151, 173, 369/170; 427/35, 38

[56] References Cited
U.S. PATENT DOCUMENTS 4,296,144  10/1981  Maby et al. ............................ 427/38
4,420,675  12/1983  Takehara ..................... 219/121 LM

FOREIGN PATENT DOCUMENTS 2072927  10/1981  United Kingdom .

Primary Examiner—Robert L. Richardson
Attorney, Agent, or Firm—Jordan & Hamburg

[57] ABSTRACT

A stylus for a capacity change detection type disc system which reads information signals such as audio or video signals out of a track which is formed in a disc surface as an arrangement of pits corresponding to the information signals has a body portion which is made of a diamond. Argon plus ions are implanted in the stylus body portion from the surface of the diamond portion to graphitize the diamond to provide a conductive layer which serves as a detecting electrode portion. The graphitizing rate is highest at the surface portion of the electrode portion which consists of the formed conductive layer. The graphitizing rate changes from the surface portion toward a portion remote from the surface portion, where the graphitizing rate is lowest, with a variation rate smaller than that of the graphitizing rate which would result from a single implantation of ions into the diamond.

12 Claims, 8 Drawing Figures

STYLUS FOR CAPACITY CHANGE DETECTION TYPE DISC SYSTEM

BACKGROUND OF THE INVENTION

The present invention relates to a stylus for use with a capacity change detection type disc system which grasps as a subtle change in capacity an audio signal, a video signal or like information signal recorded densely in an information recording medium in the form of a disc, and reads it out as an electric signal to reproduce the informtion signal. More particularly, the present invention is concerned with a stylus of the capacity change detection type in which a slide surface forms an essential part of the stylus and is slidingly engagable with a track on a disc, which is formed as a geometrical arrangement of pits representative of information signals, and in which an electrode portion is provided on the stylus for picking up the information signals in the track when the stylus traces the track causing a variation of electrostatic capacitance between the electrode and the pits. Still more particularly, the present invention is concerned with a capacity change detection type stylus in which the electrode portion is formed in a diamond body of the stylus body itself by implanting or injection ions into the diamond body.

Various kinds of disc systems have recently been developed which commonly serve to read or reproduce out of a disc audio, video or like information signals which are recorded in a high density in the disc. They include systems which are known as the VHD (Video High-Density Disc) system, AHD (Audio High-Density Disc) system, CED (Capacitance Electronic Disc) system. In such disc systems, information signals such as audio or video signals are stored in a high density in tracks which are formed in a disc as a spiral or concentric strings of pits corresponding to the information signals. The information signals are grasped as changes in capacity and detected and reproduced as changes in an electric signal. In the so-called capacity change detection type disc system described, information signals densely recorded in tracks on a disc are detected by an electrode portion formed in a stylus as changes in capacity and, therefore, the resolution attainable with the electrode portion may be noticeably increased by designing the thickness of the electrode portion sufficiently small relative to the pit size in the direction of tracking. For this reason, the disc system of the type described has an advantage that information signals can be recorded and reproduced even if the revolving speed of a disc is lowered, as well as other various advantages, thereby attracting increasing attention as one of high density recording and playback systems for discs.

Referring to FIG. 1, a disc D and a stylus S in accordane with a disc system of the type described are shown in a relative position for reading informtion signals out of a track of the disc D. As shown, the disc D has numerous pits p, p, p, . . . formed in its surface in correspondence with information signals. The stylus S comprises a body portion 10 made of diamond, and a detecting electrode portion 20 dispositied on the body portion 10. The disc D is rotated as indicated by the arrow X in FIG. 1.

In the above-described type of disc system, the stylus body 10 comprises integrally therewith a slide surface slidingly engagable with a track on the disc as previously described, and the electrode portion 20 which intersects the slide surface at its end portion whose thickness is not more than one half the shortest recording wavelength assigned to the disc or the pit size previously mentioned, that is, the electrode end portion forms only a fractional part of the slide surface. In this construction, the stylus S remains in sliding contact with the disc D, which is rotatable at a high speed, while information signals are read out of the disc D. It is therefore a primary requisite that the stylus S prevents the electrode portion 20 from flaking off of its body 10 while making contact with the pits and detecting information signals with a desirable carrier-to-noise (C/N) ratio.

Typical of prior art styluses of the type with which the present invention is concerned is one having the detecting electrode portion 20 which is a thin layer of a conductive material deposited on a diamond, which constitutes the stylus body 10, by vacuum evaporation or a metal sputtering process. A problem encountered with such a stylus is that, because the conductive material deposited on the stylus body 10 wears easily, difficulty is experienced in producing the stylus body 10 with a predetermined electrode configuration by grinding off the stylus body leaving the desired predeposited conductive layer on the desired facet, i.e. the electrode portion 20. It is also difficult to form the electrode portion 20 to an even thickness on the predetermined surface of the stylus body 10, resulting in scattering in the characteristics of the products. Additionally, the conductive layer on the stylus body 10 is eventually apt to flake off while the styplus S is contacting the pits on the disc surface.

Efforts have heretofore been made to provide a stylus which is free from the drawbacks inherent in a capacity change detection type stylus having the conventional structure. In fact, there has recently been proposed a stylus of the type described having a unique structure in which both the side surface engagable with a track or pits on a disc and the electrode portion responsive to a change in the electrostatic capacitance as described are formed integrally with the diamond structure of the stylus body, particularly a stylus having an electrode portion formed in the diamond itself by implanting ions therein (see Japanese Utility Model Publication No. 57-40422/1982 and Japanese Patent Laid-Open Publication No. 56-153545/1981 for example).

In detail, metal ions, semi-metal ions or non-metal ions are implanted into the material which constitutes the stylus body, i.e. diamond which consists of carbon atoms and serves as an insulator. Then, the implanted ions function as an acceptor or a doner or transforms the diamond bond into a graphite bond, allowing the diamond converted to graphite to exhibit conductivity. Utilizing such a phenomenon, the proposed stylus implants ions into the diamond of a stylus body to form a conductive layer and uses this layer as an electrode portion responsive to a change in capacity.

When a dose of $10^{15}$ ions per square centimeters is implanted by a single injection into the diamond, the diamond shows a graphitizing rate as shown in FIG. 2, for example, in the depthwise direction from its surface. The graphitized part (graphitized layer) of the diamond is lowered in specific resistance down to about $10^{-3}$ ohm centimeters. Therefore, it is possible to form integrally with the diamond a detecting electrode portion consisting of a graphitized layer (hereinafter, sometimes referred to as a conductive layer consisting of a graphitized layer or simply as a conductive layer) by implanting ions into the diamond.

Also, the conductive layer developing in the diamond due to ion implantation is contollable in electric resistance, mechanical strength and the like by varying the implantation conditions. Furthermore, the implantation depth and the ion density profile are reproducible with considerable accuracy so that the electrode portion comprising a conductive layer prepared by ion implantation as described allows less scattering and attains higher mechanical resistance than the prior art electrode structure in which a conductive layer is deposited on a diamond. It will thus be seen that the stylus having an electrode portion formed by ion implantation is more desirable in various respects than the typical prior art stylus of the same type.

Now, the electric resistance and the mechanical strength of the conductive layer consisting of the graphitized layer developed in a diamond by ion implantation vary in matching relation with the graphitizing rate of the graphitized layer. Therefore, in the proposed stylus of the type described, the conductive layer provided by the single dose implantation undergoes a variation in graphitizing rate as shown in FIG. 2. In FIG. 2, toward deeper portions the graphitizing rate increases to exhibit a maximum at a portion of the diamond a little deeper than the surface of the diamond which ions hit first and penetrate (i.e. the surface of the electrode portion), then the graphitizing rate sharply decreasing from that portion deeper into the diamond as represented by an approximated straight line K1. This causes a sharp change in the depthwise direction to occur in the mechanical strength at the border of the electrode portion, the graphitizing rate of which sharply changes in the depthwise direction from the surface of the electrode portion. One way of determining such graphitizing rate is observing a color change of the diamond material under a scanning electron microscope. It has been studied and discovered by the inventor that while the stylus is kept in sliding contact with a moving disc for playback, the electrode portion tends to flake off the stylus body at the border where the sharp change in mechanical strength occurs. This is concluded from the fact that due to the low graphitizing rate on the surface of the electrode portion of the stylus, stresses concentrate at the sharp corner of the side surface and the electrode portion which is less susceptive to wear but transmits the stress further up to other parts of the electrode.

FIG. 3 is a fragmentary enlarged side elevation of the stylus S for illustrating the problem discussed above. In FIG. 3, the concentration of stresses occur at a sharp corner 22 of the electrode portion 20. The graphitizing rate sharply changes at the specific part of the electrode portion 20 of the stylus S which is designated by the reference numeral 24. The phantom line in FIG. 3 represents part of the electrode portion 20 which was removed due to flaking off.

The present invention has been elaborated to solve the various problems discussed hereinabove in conjunction with a prior art stylus of the capacity change detection type.

SUMMARY OF THE INVENTION

It is therefore an object of the present invention to provide an improved stylus for a capacity change detection type disc system having an electrode made by an ion implantation process being controlled so that the highest graphitization develops in the vicinity of the surface portion of the diamond.

It is another object of the present invention to provide an improved stylus for a capacity detection type disc system which engages with a disc surface with a minimum of wear and, therefore, withstands a long time of use.

It is another object of the present invention to provide an improved stylus for a capacity change detection type disc system in which a detecting electrode portion formed integrally with a diamond which constitutes a stylus body does not easily flake off and, if it does come off, does not extend to the entire electrode portion but is limited to a fraction.

It is another object of the present invention to provide a generally improved stylus for a capacity change detection type disc system.

A stylus for a capacity change detection type disc system for reproducing information signals from a track which is formed on a surface of a disc as a geometrical arrangement of pits corresponding to the information signals of the present invention comprises a stylus body portion having a slide surface slidingly engageable with the track on the disc surface and made of a material which is graphitizable, and an electrode portion provided on the stylus body portion having an intersecting relationship with the slide surface for detecting the information signals recorded on the track in the disc surface as a capacitance variation between the electrode portion and the pits and being formed integrally with the material of the stylus body portion by implantation of ions into the material such that a graphitizing is concentrated most in the vicinity of the surface of the electrode portion and less concentrated in the portion remote from the surface, and varied continuously from the vicinity to the portion remote from the vicinity in depthwise such that a gradient of approximated variation of the graphitizing with respect to the distance from the surface is smaller than that of the approximated variation of the graphitizing rate of the material which results from a single dose implantation of ions into the material.

The above and other objects, features and advantages of the present invention will become apparent from the following detailed description taken with the accompanying drawing.

The term "dose" in this specification means a number of ions emitted into one square centimeter of a cross section of a stream of ions toward the object to be ion implanted. In this arrangement, the object, i.e. the diamond material for the stylus having much smaller profile than one square centimeter, is exposed to the stream of ions causing the profile to receive a portion of ions in the stream.

DESCRIPTION OF THE PREFERRED EMBODIMENTS

While the capacity change detection type stylus of the present invention is susceptible of numerous physical embodiments, depending upon the environment and requirements of use, substantial numbers of the herein shown and described embodiments have been made, tested and used, and all have performed in an eminently satisfactory manner.

Figure 4:
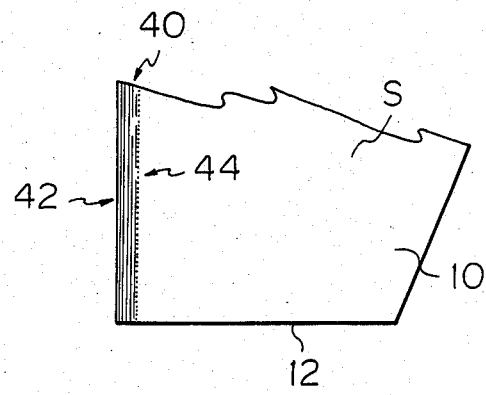
Figure 5:
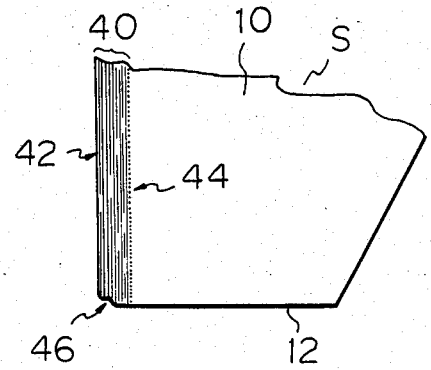

Referring to FIG. 4, a stylus S in accordance with the present invention comprises a stylus body 10 which is made of a diamond. The stylus body 10 has a slide surface 12 slidingly engagable with a track on a disc which is an arrangement of pits corresponding to information signals. An electrode portion 40 is adapted to pick up the information signals stored in the track as changes in the quantity of electricity which represent changes in capacity. The slide surface 12 and the electrode portion 40 are formed in the diamond itself and the electrode portion 40 is composed in the diamond by implantation of ions.

Figure 1:
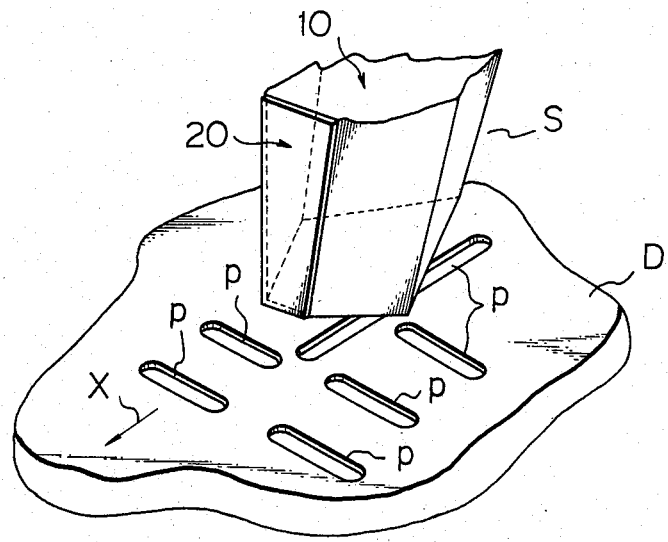
FIG. 1 is a fragmentary perspective view of a stylus for use with a capacity change detection type disc system and a disc.
Figure 2:
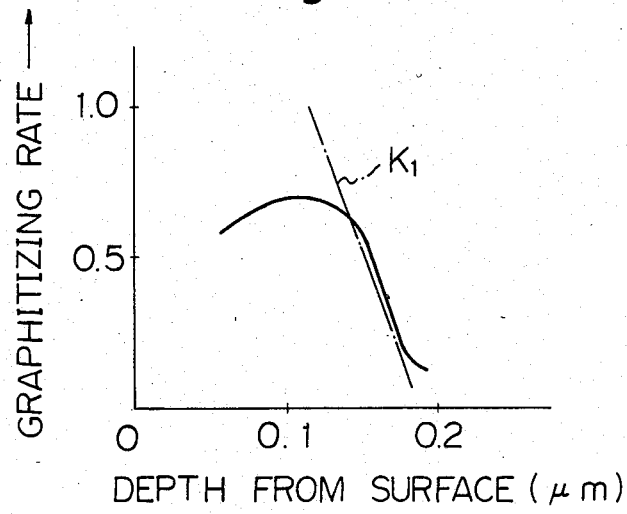
FIG. 2 is a graph showing the relationship between a graphitizing rate of a diamond which forms a body of a stylus and the depth from the surface of the diamond.

In such a stylus in accordance with the present invention, the graphitizing rate of the electrode portion 40 is concentrated in the vicinity of surface portion 42 and varies therefrom toward the portion 44 opposite to the surface portion 42 where it is less concentrated. The average variation rate of the graphitizing rate of the diamond from the portion 42 over to the portion 44 is smaller than that which would result from a single dose implantation of ions into the diamond. In the stylus S of the present invention, the conductive layer consisting of the graphitized diamond layer, which forms the electrode portion 40, has a graphitizing rate which may continuously vary either along a curve as indicated by the solid line in FIG. 6 or along a stepwise line as indicated by the solid line in FIG. 7. In any case, in the stylus of the present invention, the graphitizing rate of the conductive layer, or graphitized diamond layer, of the electrode portion 40 is highest in the vicinity of the surface portion 42, lowest in the portion 44 remote from the surface portion 42, and varied from the portion 42 to the portion 44 in such a way that with respect to the depth it can be approximately represented by the dash-and-dot line K2 in FIG. 6 or the dash-and-dot line K3 in FIG. 7, the gradients of the lines being both varition of the graphitizing and being less steeper than the gradient of the variation of the graphitizing of the diamond represented by the dash-and-dot line K1 in FIG. 2, which is the result of a single dose ion implantation in a diamond.

Figure 6:
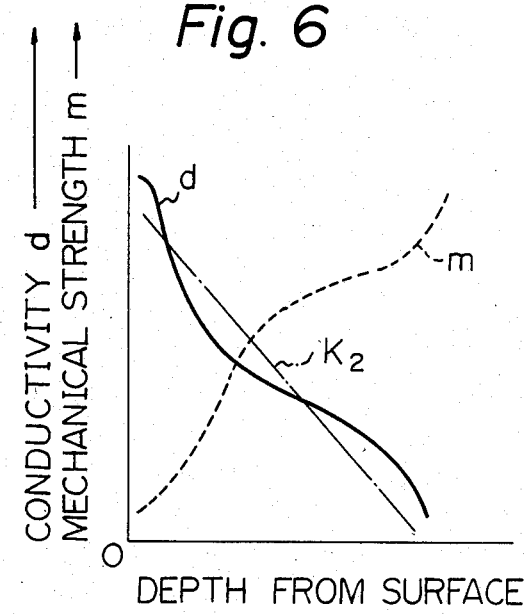
FIGS. 6 and 7 are graphs showing the conductivity and mechanical strength of a diamond which forms a stylus body with respect to the depth from the surface of the diamond.
Figure 7:
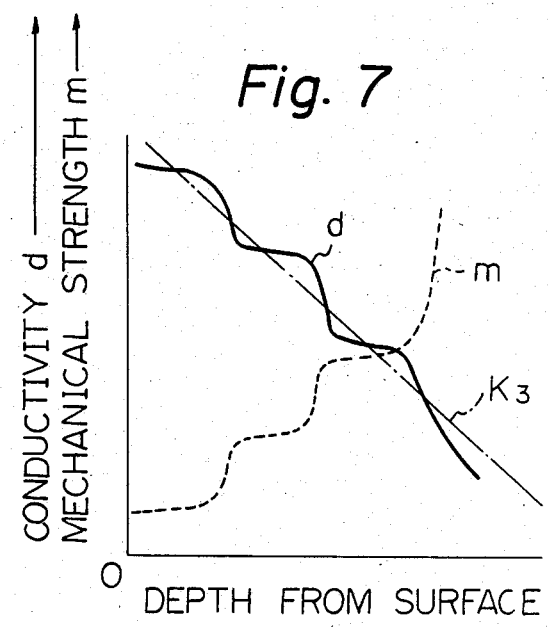

In FIGS. 6 and 7, the solid line d indicates conductivity and m, mechanical strength. The conductivity of a diamond graphitized by ion implantation has correspondence with the graphitizing rate of the diamond as previously stated, so that the conductivity represented by the solid line d in FIG. 6 or 7 may be regarded as representing the graphitizing rate of the diamond. While in the example shown in FIG. 6 the conductivity of the electrode portion 40 varies continuously along a curve from the surface portion 42 in the depthwise direction, it will be apparent to those skilled in this art that the electrode portion 40 may be formed such that its conductivity varies linearly in the same direction.

Figure 8:
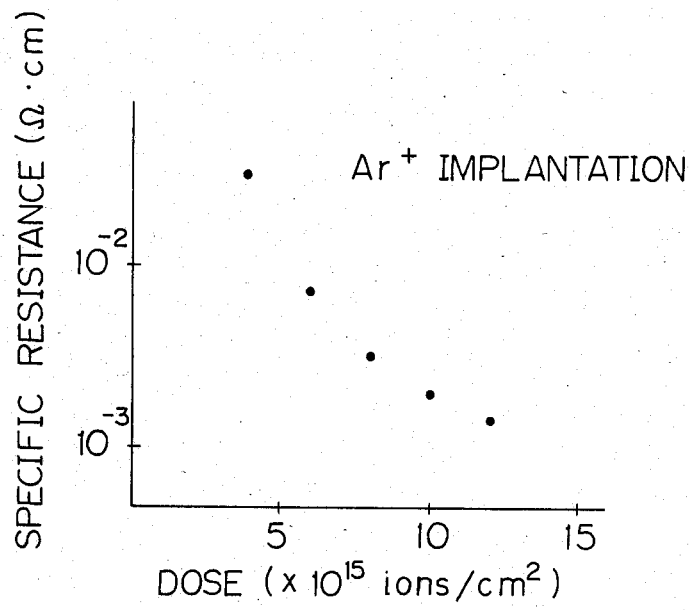
FIG. 8 shows a change in the specific resistance of a diamond which may constitute a stylus body, with respect to a change in dose when argon plus ions are injected into the diamond under the 190 kV of acceleration voltage, the plots being specific resistance values calculated from resistance measurements performed on a diamond strip having 2000° of thickness, by providing conductors at opposite ends of the strip.

FIG. 8 is a plot which shows for reference purpose how the specific resistance of a diamond varies in response to a change in dose when $Ar^+$ (argon plus) ions are implanted in the diamond.

Hereinafter will be described an example of the stylus of the present invention which was produced such that the electrode portion 40 formed by ion implantation has conductivity which is continuously lowered along a curve from the surface 42 in the depthwise direction, as represented by the soild line d in FIG. 6.

$Ar^+$ ions were implanted in the diamond of the stylus body 10. A total dose was limited to $1 \times 10^{17}$ ions and the ion acceleration voltage was varied from 10 kilovolts to 200 kilovolts continuously on the time axis and, likewise, the dose rate was varied along a curve continuously on the time axis in the range between $5 \times 10^{16}$ and $2 \times 10^{15}$ ions per square centimeter and was controlled to decrease as the acceleration voltage increased. This caused the diamond to develop an electrode portion 40 having the desired conductivity which was varied continuously along a curve.

Another practical example of the stylus of the present invention is described as follows. The stylus was produced such that the conductivity of the electrode portion 40 was lowered continuously but stepwise from the surface 42 in the depthwise direction.

Again, use was made of $Ar^+$ ions as ions to be implanted in the diamond of the stylus 10. The ion acceleration voltage and the dose were varied stepwise on the time axis as shown in Table 1. The resulting electrode portion 40 in the diamond exhibited conductivity which was varied continuously and stepwise as expected.

TABLE 1

|  | STEP 1 | STEP 2 | STEP 3 | STEP 4 | STEP 5 |
|---|---|---|---|---|---|
| ACCELERATION VOLTAGE (kV) | 40 | 80 | 120 | 170 | 200 |
| TOTAL DOSE of each step | $5 \times 10^{16}$ | $3 \times 10^{16}$ | $1.2 \times 10^{16}$ | $7 \times 10^{15}$ | $2 \times 10^{15}$ |

In Table 1, the doses are indicated in terms of the number of ions emitted into one square centimeter. In each of the examples described above, the ion acceleration voltage and dose may be varied on the time axis using a machine marketed by NISSIN-HIGH VOLTAGE CO, LTD. by the tradename of NISSIN ION IMPLANTATION SYSTEM 200 keV or VARIAN EXTRION model CF 200. In these examples, the acceleration voltage is increased toward the end of the process. It should be noted that ion penetration into the diamond material is controlled by varying the acceleration voltage where the penetration occurs without decomposing or being disturbed by the previously formed graphitized layer which is formed under lower acceleration voltage. Thus, the processing order or steps may be reversed or randomly performed for any reason to achieve the same result.

Figure 3:
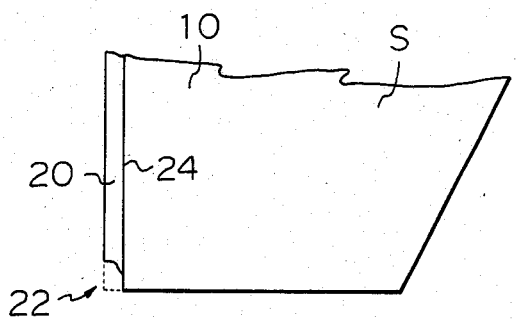
FIGS. 3–5 are fragmentary enlarged side elevations of styluses each having a detecting electrode portion formed on a stylus body.

As described hereinabove, a capacity change detection type stylus of the present invention has an electrode portion 40 formed integrally with a diamond portion and provided with a graphitizing rate which is highest in the surface portion 42 of the electrode 40, lowest in the portion 44 opposite to the surface portion 42 in the depthwise direction, and varied from the portion 42 to the portion 44 with an approximate varition rate change, a gradient of which is smaller than that of the graphitizing rate of a diamond resulting from a single dose ion implantation. In such a stylus configuration, the electrode portion developed by ion implantation in the diamond of a stylus body 10 is lowest in electric resistance at the vicintiy of its surface where the graphitizing is highly concentrated, and is the first to wear. Therefore, the sharp corner where the surface 42 and slide surface 12 of the electrode portion 40 merge will be rounded during use of the stylus S, thereby allowing no stress to conentrate thereof which would otherwise cause flake-off of a large portion of the electrode. Flaking, if developed in the electrode portion 40, would be confined only to a limited portion where the graphitizing rate is high, and not extend to the whole electrode portion 40. Therefore, the stylus S is capable of maintaining an acceptable degree of playback performance if flaking occurs. In contrast, the prior art stylus shown in FIG. 3 would allow the flaking to extend to the entire electrode portion, thus completely losing the expected playback function.

In summary, it will be seen that the present invention provides a capacity change detection type stylus which eliminates all the drawbacks from which the prior art stylus of the type described have suffered.

Various modifications will become possible for those skilled in the art after receiving the teachings of the present disclosure without departing from the scope thereof.

What is claimed is:

1. A stylus for a capacity change detection type disc system for reproducing information signals from a track which is formed on a surface of a disc as a geometrical arrangement of pits corresponding to the information signals, comprising:
    a stylus body portion having a slide surface slidingly engageable with the track on the disc surface and made of a material which has the property that it is graphitizable when subjected to ion implantation; and
    an electrode portion provided on said stylus body portion having an intersecting relationship with said slide surface for detecting the information signals recorded on the track in the disc surface as a capacitance variation between the electrode portion and said pits and being formed integrally with said material of the stylus body portion by implantation of ions into said material, said electrode portion having graphitization concentrated most in the vicinity of the surface of said electrode portion and less concentrated in a portion remote from said surface and which varies continuously depthwise from said vicinity of said surface to said remote portion, said continuous depth-wise variation being obtained by implanting ions onto said stylus body portions and controlling the implantation by varying the ion acceleration voltage and the dose rate such that the approximated gradient of said continuous depth-wise variation is smaller than the approximated gradient which results from a single dose of implantation of ions.

2. A stylus as claimed in claim 1, in which the material constituting the stylus body portion is diamond.

3. A stylus as claimed in claim 1, in which the rate of graphitization of the material in the electrode portion varies continuously along a curve with respect to the depth of the electrode portion from said surface.

4. A stylus as claimed in claim 1, in which the rate of graphitization of the material in the electrode portion varies continuously and linearly with respect to the depth of the electrode from said surface portion.

5. A stylus as claimed in claim 1, in which the rate of graphitization of the material in the electrode portion varies continuously and stepwise with respect to the depth of the electrode from said surface portion.

6. A stylus as claimed in claim 1, in which the ions are argon plus ions.

7. A stylus as claimed in claim 6, in which the ions are implanted while varying at a predetermined rate the acceleration voltage and the dose continuously on a time axis.

8. A method of producing a stylus having improved wear characteristics for a capacity change detection type disc system for reproducing information signals from a track which is formed on a surface of a disk as a geometrical arrangement of pits corresponding to the information signals, said stylus being of the type having a stylus body portion having a slide surface slidingly engageable with the track on the disc surface and an electrode portion on said stylus body portion having an intersecting relationship wish said slide surface for detecting the information signals recorded on the track in the disk surface as a capacitance variation between the electrode portion and said pits, comprising the steps of utilizing a stylus body portion which is made of a material which is graphitizable by ion implantation, implanting ions onto said stylus body portion, varying the implantation conditions by varying the ion acceleration voltage and the dose rate during said implanting step, and forming said electrode portion with graphitization which is concentrated most in the vicinity of the surface of said electrode portion and less concentrated in the portion remote from said surface and which varies continuously depthwise from said vicinity of said surface to said remote portion such that the gradient of approximated variation of the graphitization is smaller than that of the gradient of approximated graphitization which results from a single dose of implantation of ions.

9. A method according to claim 8, wherein said step of varying the implanting conditions comprises increasing the ion concentration voltage and decreasing the acceleration voltage.

10. A method according to claim 9 further comprising continuously increasing the ion concentration voltage on the time axis and continuously decreasing the acceleration voltage on the time axis.

11. A method according to claim 9 further comprising stepwise increasing the ion concentration voltage on the time axis and stepwise decreasing the acceleration voltage on the time axis.

12. A method according to claim 8 further comprising utilizing argon plus ions for said ion implantation.

* * * * *